United States Patent
Jung et al.

(10) Patent No.: US 6,867,141 B2
(45) Date of Patent: Mar. 15, 2005

(54) METHOD FOR FABRICATING SEMICONDUCTOR DEVICE AND FORMING INTERLAYER DIELECTRIC FILM USING HIGH-DENSITY PLASMA

(75) Inventors: Woo Chan Jung, Seoul (KR); Jong Koo Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 47 days.

(21) Appl. No.: 10/453,584

(22) Filed: Jun. 4, 2003

(65) Prior Publication Data

US 2003/0207553 A1 Nov. 6, 2003

Related U.S. Application Data

(62) Division of application No. 10/140,286, filed on May 8, 2002, now Pat. No. 6,617,259.

(30) Foreign Application Priority Data

Jul. 7, 2001 (KR) ........................................ 2001-40686

(51) Int. Cl.[7] ............................................. H01L 21/311
(52) U.S. Cl. ........................ 438/695; 438/703; 438/463
(58) Field of Search .............................. 438/694–695, 438/703, 763

(56) References Cited

U.S. PATENT DOCUMENTS 5,124,014 A * 6/1992 Foo et al. .................. 438/694
5,270,264 A * 12/1993 Andideh et al. ............ 438/703
5,275,977 A * 1/1994 Otsubo et al. .............. 438/695
5,918,152 A   6/1999 Erzhuang et al.
6,048,802 A   4/2000 Avanzino et al.
6,133,160 A   10/2000 Komiyama et al.
6,291,030 B1  9/2001 Chao et al.
6,319,849 B1  11/2001 Oda et al.
6,358,862 B1  3/2002 Ireland et al.
6,410,458 B1  6/2002 You et al.
6,511,923 B1  1/2003 Wang et al.

* cited by examiner

Primary Examiner—David S. Blum
(74) Attorney, Agent, or Firm—Volentine Francos, PLLC

(57) ABSTRACT

A method for fabricating a semiconductor device and forming an insulating film used therein, includes forming an isolation insulating film on a semiconductor wafer and forming gates, separated by gaps having a predetermined distance, on an active region. Next, a first interlayer dielectric film is deposited to a predetermined thickness on the semiconductor wafer having the gates, so that the gaps between the gates are not completely filled. Then, a sputtering etch is performed entirely on a surface of the first interlayer dielectric film. Thereafter, the first interlayer dielectric film is partially removed through isotropic etching. Next, a second interlayer dielectric film is deposited on the first interlayer dielectric film so that the gaps between the gates are completely filled. According to the above method, a gap between gate patterns can be completely filled without a void by performing sputtering etch on interlayer dielectric films formed on gate patterns, thereby enhancing the reliability of a semiconductor device.

25 Claims, 8 Drawing Sheets

| STEP\ITEM | | 1ST STEP (SiO$_2$ DEPOSITION) | 2ND STEP (SPUTTERING ETCH) |
|---|---|---|---|
| GAS (sccm) | SiH$_4$ | 30 ~ 300 | 0 |
| | O$_2$ | 50 ~ 500 | 0 ~ 500 sccm |
| | He | 50 ~ 1000 | 0 ~ 1000 sccm |
| POWER (W) | H·F | 500 ~ 1500 | 500 ~ 3000 |
| | L·F | 2500 ~ 3500 | 3000 ~ 5000 |

METHOD FOR FABRICATING SEMICONDUCTOR DEVICE AND FORMING INTERLAYER DIELECTRIC FILM USING HIGH-DENSITY PLASMA

CROSS-REFERENCES TO RELATED APPLICATIONS

This application relies for priority upon Korea Patent Application No. 2001-40686, filed on 7 Jul. 2001, the entire contents of which are hereby incorporated herein by reference in their entirety for all purposes as if fully set forth herein. This is a divisional of application Ser. No. 10/140,286, filed 8 May 2002 now U.S. Pat. No. 6,617,259, which is incorporated herein by reference in its entirety.

BACKGROUND OF THE INVENTION

1. Field of the Invention

The present invention relates to a method for fabricating a semiconductor device and forming an interlayer dielectric film, and more particularly, to a method for forming an interlayer dielectric film using high-density plasma.

2. Description of the Related Art

As the integration density of semiconductor devices increases, the distance between devices gets narrower. Thus the critical dimensions of the gate of a MOS transistor, which is one of the main constituents for a semiconductor device, become very small. As a result, the distance between gates becomes shorter. Moreover, since self-aligned contacts are made in highly integrated semiconductor devices such as DRAM cells, the height of a gate can be sufficiently increased, but the depth of a gap between gates is comparatively deep compared to the width of the gate. In this regard, it has been a matter of concern to fill a gap between gates with an insulating film.

Borophospho-silicate glass, which has a high flowability at high temperature; has usually been used as an interlayer dielectric film formed between gates, but it cannot be used during a process of fabricating a highly integrated semiconductor device in which a high temperature process is not available. Instead, an interlayer dielectric film formed of high-density plasma has been used in fabricating a semiconductor device. This interlayer dielectric film is obtained by depositing a silicon oxide film to a predetermined thickness by chemical vapor deposition (CVD) using high-density plasma (HDP) after a gate is formed, removing the silicon oxide film through a wet-etching method, and finally, forming a silicon oxide film thereon by the CVD using HDP.

However, when using the interlayer dielectric film formed as described above, voids due to porous defects are easily formed between gates (refer to FIG. 11), which can cause physical cracking around the voids during the subsequent process of forming films such as a bit line, or degradation of the electric device's characteristics, e.g., a short circuit in a gate line, after the completion of a semiconductor device.

SUMMARY OF THE INVENTION

To solve the above problem, an objective of the present invention is to provide methods for fabricating a semiconductor device and forming an interlayer dielectric film using high-density plasma, so that a void does not occur between gates when forming an interlayer dielectric film after the formation of a gate.

In order to achieve the above objective, there is provided a method for fabricating a semiconductor device. In the method, an isolation insulating film is formed on a semiconductor wafer and gates separated by a gap having a predetermined distance are formed on an active region. Next, a first interlayer dielectric film is deposited to a predetermined thickness on the semiconductor wafer having the gates, so that the gaps between the gates are not completely or sufficiently filled. Then, a sputtering etch is performed entirely on a surface of the first interlayer dielectric film to etch a predetermined thickness of the first interlayer dielectric film. Thereafter, the first interlayer dielectric film is partially removed through isotropic etching. Then, a second interlayer dielectric film is deposited on the first interlayer dielectric film so that the gaps between the gates are completely filled.

Here, the isolation insulating film formed on a semiconductor wafer is formed by forming a gate dielectric film on the active region of the semiconductor wafer, forming a gate conductive film on the gate dielectric film, forming a gate pattern by patterning the gate conductive film and forming a spacer dielectric film along the sidewall of the gate pattern. Also, when the gate conductive film is formed, an insulating film is formed as a mask layer on the gate conductive film, so that a self-aligned contact can be easily made after the formation of the gate pattern.

The first interlayer dielectric film is preferably formed of a silicon oxide film having excellent step coverage and fast deposition rate by chemical vapor deposition using a high-density plasma. Silane gas ($SiH_4$) is beneficially used as silicon source gas in the silicon oxide film.

After the first interlayer dielectric film is completed, a sputtering etch is performed to etch a predetermined thickness of the first interlayer dielectric film in situ. At this time, it is preferable to use helium gas or oxygen gas as an atmospheric gas during the sputtering etch, so that the plasma can be easily generated and the filling characteristics and particle characteristics of the silicon oxide film can be enhanced.

Thereafter, the silicon oxide film formed on the semiconductor wafer is partially removed by a wet-etching method, so that an irregular deposition made during the deposition process using plasma is removed and the profile of the pattern becomes round, to be easily filled during a subsequent process of depositing another insulating film thereon.

Then, a second interlayer dielectric film is deposited to entirely fill the gap between gate patterns. Here, it is preferable that a silicon oxide film is used as the second interlayer dielectric film and the deposition is performed by high-density plasma chemical vapor deposition, so that the time needed for the deposition is reduced.

As described above, in a method of fabricating a semiconductor device, after the formation of the gate patterns, an interlayer dielectric film is obtained by forming a silicon oxide film using high-density plasma and then, performing a sputtering etch thereon using He or $O_2$ gas in situ. Therefore, the gap between gate patterns can be filled without a void, thereby enhancing physical reliability and electric stability of a semiconductor device.

Meanwhile, in order to achieve the above objective, there is provided a method of forming an interlayer dielectric film using high-density plasma on a semiconductor wafer, using an apparatus for fabricating a semiconductor device. Here, the apparatus of fabricating a semiconductor device includes a reactor having a wafer supporter on which a semiconductor wafer is placed and a gas supplier for supplying reactant gas to the semiconductor wafer, and is used for generating high-density plasma for chemical vapor deposition. To form an interlayer dielectric film, the semiconductor wafer having a predetermined pattern is placed in the reactor. Then, a reactant gas is supplied to the semiconductor wafer in the reactor while the reactor is maintained at a low pressure. Next, the reactant gas is changed into a plasma state and the plasmic reactant gas is brought into contact with the surface of the semiconductor wafer, so that an interlayer dielectric film is formed. Thereafter, an atmospheric gas is provided into the reactor and then, a sputtering etch is performed on the interlayer dielectric film by changing the atmospheric gas into plasma and colliding the same against the wafer surface.

Here, it is preferable that silane gas ($SiH_4$) and oxygen gas ($O_2$) are used as the reaction gas, and more oxygen gas ($O_2$) than silane gas ($SiH_4$) is supplied to stably form a silicon oxide film. At this time, the silane gas ($SiH_4$) is supplied at a flow rate of 30~300 sccm. To obtain the favorable characteristics of the silicon oxide film, it is preferable that oxygen gas ($O_2$) and helium gas (He) are supplied as reactant auxiliary gases. Also, at this time, the oxygen gas ($O_2$) is supplied at a flow rate of 50~500 sccm and the helium gas (He) is supplied at a flow rate of 50~1000 sccm.

During the deposition of the silicon oxide film, gases supplied in the reactor can be changed to a plasmic state by applying to the reactor radio frequency (RF) power, which is high-frequency power, in the range of 500~1500 W. Also, low-frequency power, which is 100~1000 KHz, is applied to the reactor in the range of 2500~3500 W, so that conditions for generating a high-density plasma are enforced.

Here, it is preferable that the high-frequency power is applied to the wafer supporter, and the low-frequency power is applied to the upper wall of the reactor, and the low-frequency power level is greater than the high-frequency power level.

During the sputtering etch, either oxygen gas ($O_2$) or helium gas (He) is used as the environmental gas. At this time, the oxygen gas ($O_2$) is supplied at a flow rate of 0~500 sccm and the helium gas (He) is supplied at a flow rate of 0~1000 sccm. Further, the high frequency power, which is radio frequency power, and the low-frequency power, which is 100~1000 KHz, are supplied to the reactor at the same time.

Also, the high-frequency power is applied to the wafer supporter in the range of 500~3000 W, and the low-frequency power is applied to the upper wall of the reactor in the range of 3500~5000 W. At this time, the low-frequency power level is greater than the high-frequency power level.

BRIEF DESCRIPTION OF THE DRAWINGS

The above objective and advantages of the present invention will become more apparent by describing in detail preferred embodiments thereof with reference to the attached drawings, in which.

DETAILED DESCRIPTION OF THE PREFERRED EMBODIMENTS

The above objective and advantages of the present invention will become apparent by describing in detail preferred embodiments thereof with reference to the appended drawings. While the present invention has been particularly shown and described with reference to the preferred embodiment(s) thereof, the present invention is not restricted to the embodiments. The embodiments of the present invention are provided to help those skilled in the art to completely understand the present invention.

Figure 1:
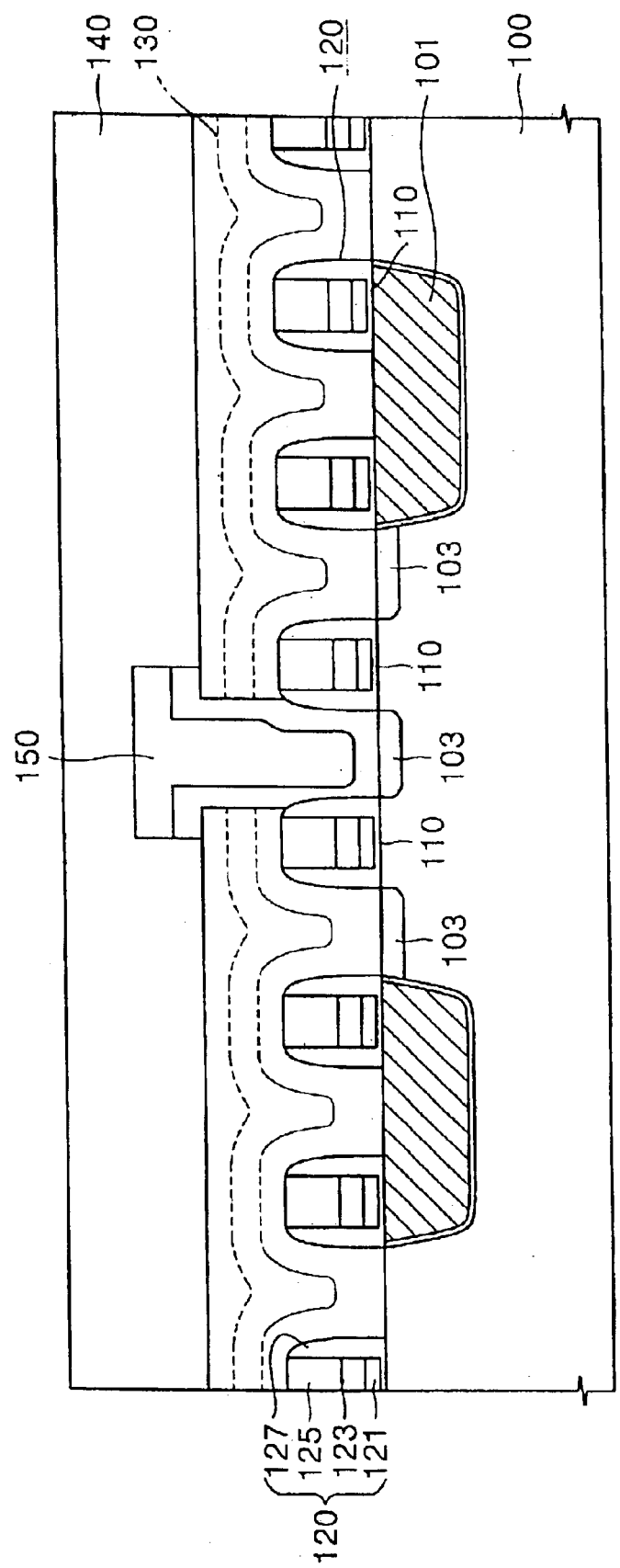
FIG. 1 is a cross-sectional view of a semiconductor device according to an embodiment of the present invention.

FIG. 1 shows a cross-section of a semiconductor device made through a method of fabricating a semiconductor device according to an embodiment of the present invention. In the semiconductor device shown in FIG. 1, trenches each having a predetermined depth are formed in a semiconductor wafer 100 made of a silicon substrate. Each of the trenches is filled with an insulating film, thereby forming an isolation oxide film 101 for isolating devices from each other. Source/drain junctions 103 are formed in an active region to be separated from each other by a predetermined distance. A plurality of gates 120 including a conductive layer and an ultra thin gate-insulating layer 110 are formed on the semiconductor wafer 100. The gaps between the gates 120 are filled with an interlayer dielectric layer 130 made by high-density plasma A bit line 150 is formed on the interlayer dielectric film 130 and a second interlayer dielectric film 140 is formed over the bit line 150. Although it is not shown, elements including a capacitor may be formed during the subsequent process.

FIGS. 2 through 6 are cross-sectional views of the semiconductor device shown in FIG. 1 for explaining a method of fabricating a semiconductor device according to an embodiment of the present invention.

Figure 2:
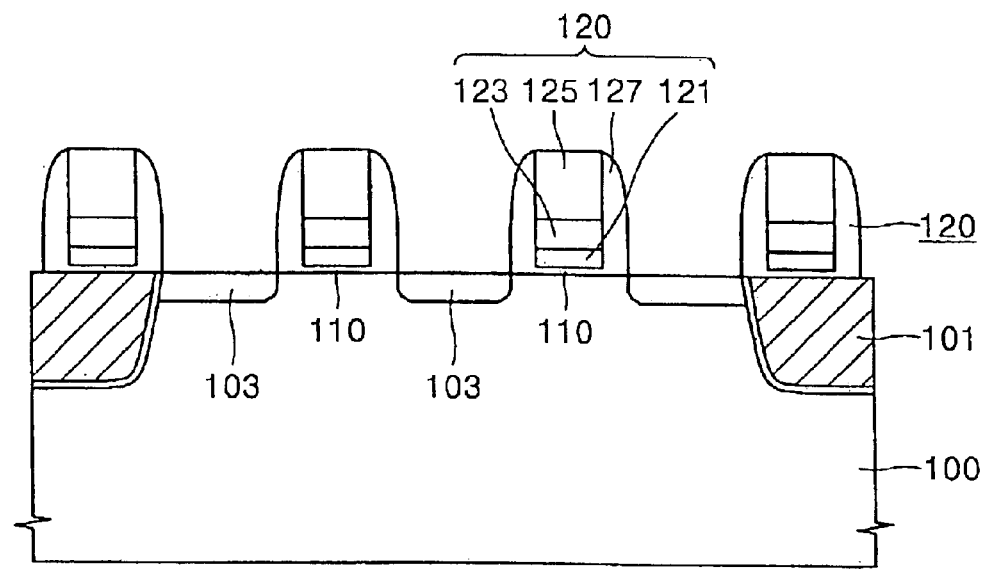
FIG. 2, FIGS. 3A and 3B, FIGS. 4 through 6 are cross-sectional views of a semiconductor wafer for explaining a method of fabricating a semiconductor device according to an embodiment of the present invention.

Referring to FIG. 2, the isolation oxide film 101 is formed on the semiconductor wafer 100 and the gates 120 are formed on the active region. The isolation oxide film 101 is obtained by a trench isolation method, i.e., by forming trenches on the semiconductor wafer 100 and then filling a silicon oxide film as an insulating film in the trench. After the isolation process is completed, the ultra thin film type gate dielectric film 110 is formed on the active region of the substrate on which an element will be formed after the isolation process. Gate conductive films 121 and 123 are sequentially formed on the gate dielectric film 110. A mask insulating film 125, which is used for forming a self-aligned contact during the subsequent process, is formed as a mask on the gate conductive films 121 and 123. Next, a gate pattern is formed on the gate conductive films 121 and 123 by general photolithography. An insulating film is formed on the gate pattern by CVD and an insulating film spacer 127 is formed along the sidewalls of the gate pattern by anisotropic etching using dry etching. As a result, a gate is completed. Meanwhile, although the disclosed embodiment uses a plurality of gate conductive films, i.e., the gate conductive films 121 and 123, it is possible to use a gate conductive film formed with a single conductive material.

Figure 3A:
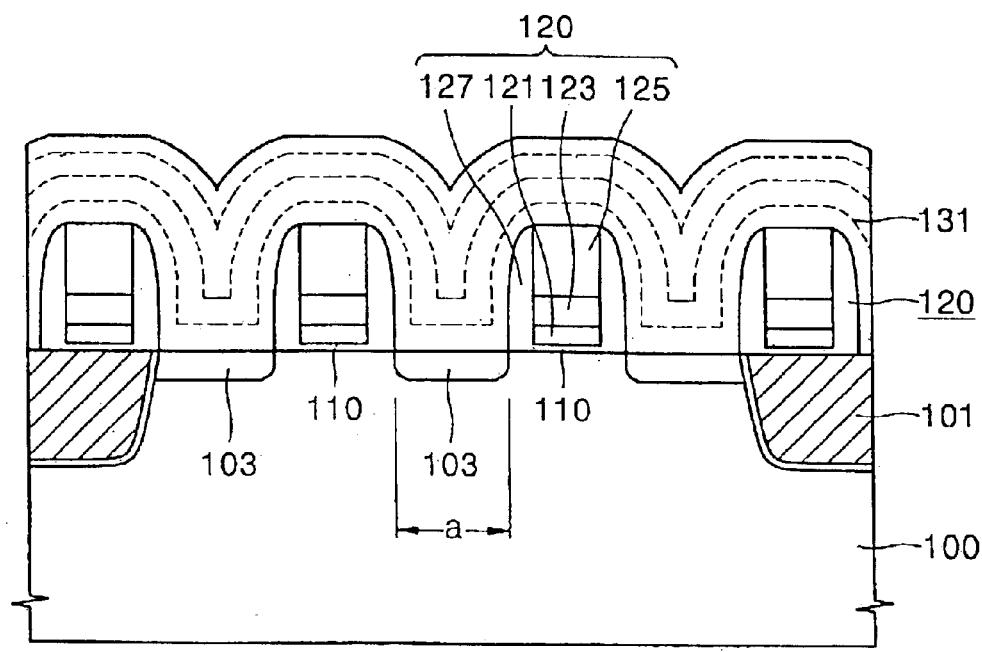
Figure 3B:
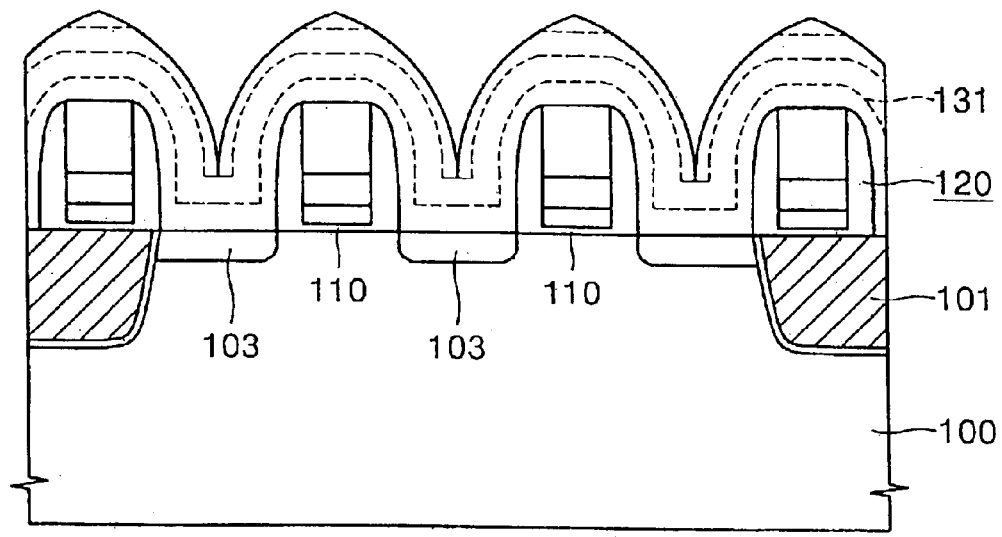

Referring to FIG. 3A, a first interlayer insulating film 131 is deposited on the semiconductor wafer 100 having the gates 120. The interlayer insulating film 131 is basically a single layer, however depending upon the process equipment, it could be formed of a multilayer insulating film by a multi-step process. It is preferable that the first interlayer dielectric film 131 is formed to have a thickness which is less than half of the distance a between the gates 120, i.e., 0.5 a, using a silicon oxide film. The obtained silicon oxide film is formed by CVD using high-density plasma, in which silane gas ($SiH_4$) is used as a silicon source gas and a combination of oxygen gas ($O_2$) and helium gas (He) is used as an oxygen source gas. Also, high-frequency electric power is used in generating plasma Referring to FIG. 3B, the silicon oxide film obtained by high-density plasma CVD is partially removed through sputtering etch, a type of dry etching method. Oxygen gas and helium gas, excluding silane gas ($SiH_4$), which was used in the aforementioned process of forming the silicon oxide film with high-density plasma, are mixed and used as an atmospheric gas. In the meantime, the etching speed of the sputtering etch depends on how strongly plasmic atmospheric gas collides against the semiconductor wafer 100, and therefore the electric power supplied must be higher than in CVD. As a result, as shown in FIG. 3B, the interlayer dielectric film 131 formed around the gate 120 has a mountain shape. That is, the sidewalls of the interlayer dielectric film 131, which is formed between the central part of the gate 120 and a gap between the gates 120, has a remarkably gentle slope, thus preventing an overhang causing a negative slope, which can easily occur during a deposition process. Consequently, when a second interlayer dielectric film 133 (refer to FIG. 5) is formed in the subsequent process, a void due to overhang occurring in the gap area between the gates 120 can be prevented. The semiconductor device obtained after the completion of all the processes related to FIGS. 1 through 3B has a cross-section shown in the photograph taken by the a scanning electronic microscope (SEM) in FIG. 9.

Figure 4:
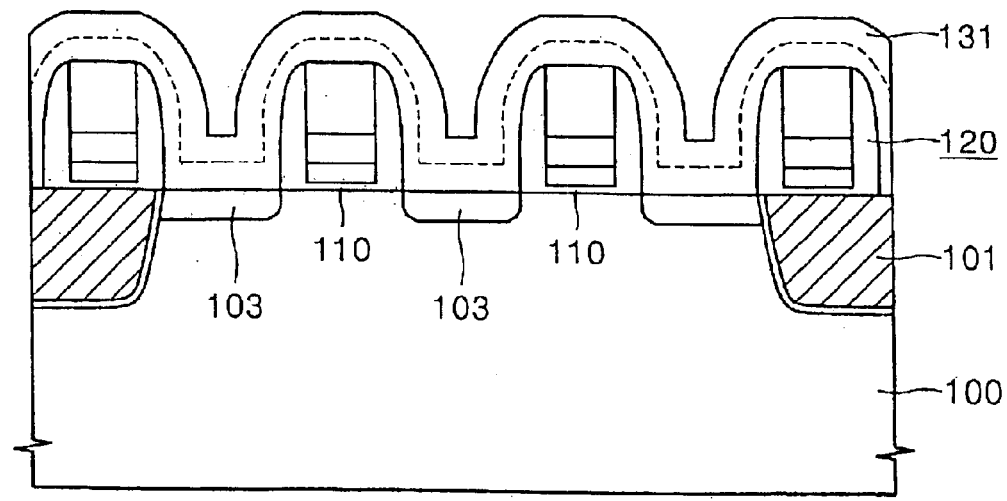
Figure 10:
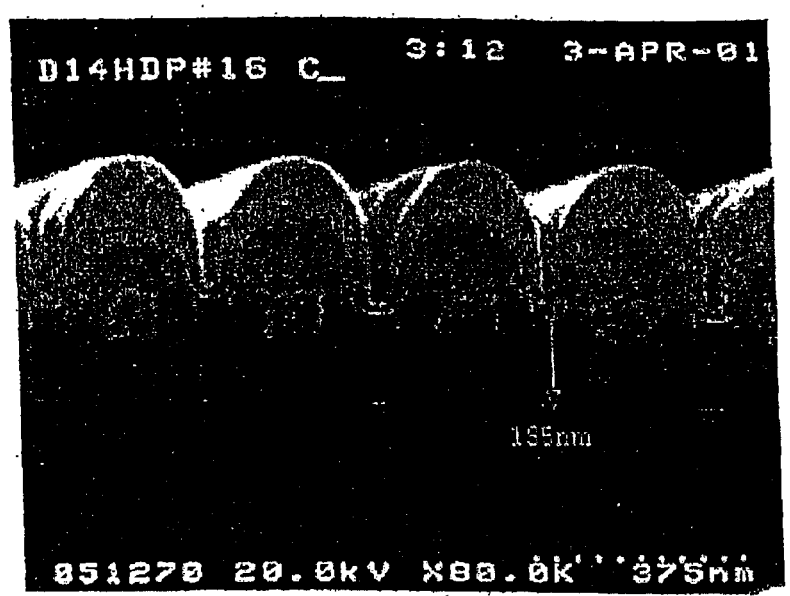
FIG. 10 shows a photograph of a cross-section of the semiconductor device shown in FIG. 4 taken by an SEM.
Figure 11:
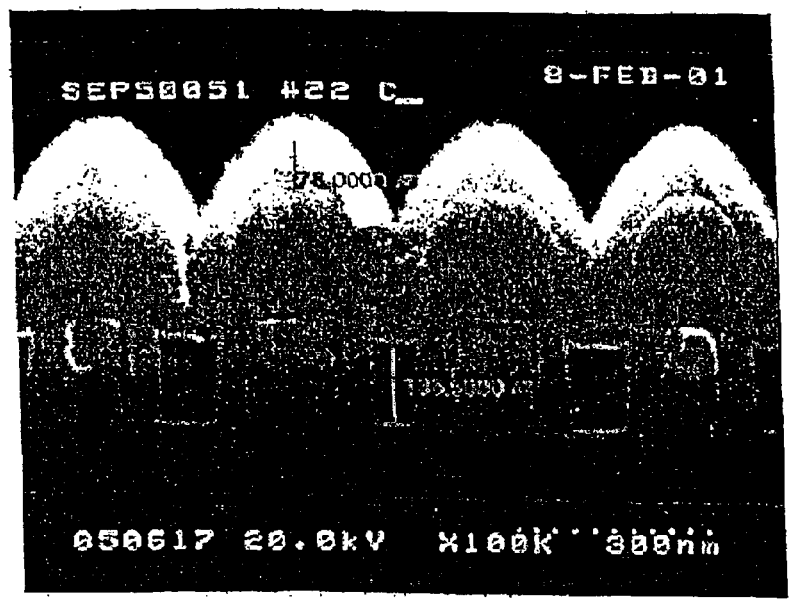
FIG. 11 shows an SEM photograph of a cross-section of a semiconductor device manufactured by a conventional method.

Referring to FIG. 4, the interlayer dielectric film 131 is isotropically etched by wet etching, so that the silicon oxide film of the irregular-shaped etched portion obtained during the aforementioned sputter etching is removed and the shape of the interlayer dielectric film 131 becomes smooth. As a result, the shape of the interlayer dielectric film having the mountain shaped is comparatively round, which will make it easy to fill a gap between the gates 120 when the second interlayer dielectric film 133 is formed. The semiconductor device obtained after the completion of all the processes related to FIGS. 1 through 4 has a cross-section shown in the photograph taken by the SEM in FIG. 10.

Figure 5:
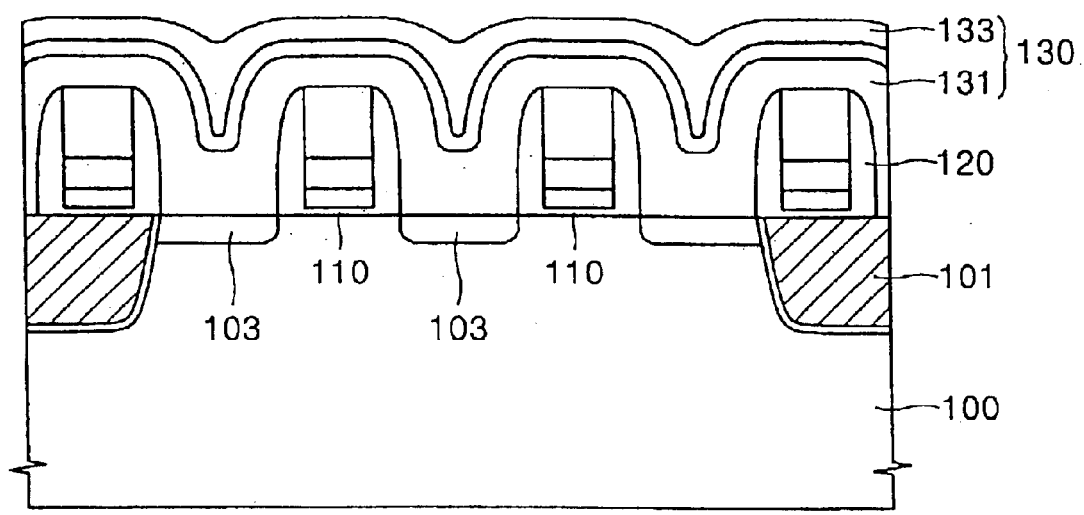

Referring to FIG. 5, the second interlayer dielectric film 133 is formed on the semiconductor wafer 100 by CVD using high-density plasma. A silicon oxide film is used as the second interlayer dielectric film 133 and silane gas ($SiH_4$) and oxygen gas ($O_2$) are used as source gases, as in the first interlayer dielectric film 131. Also, helium (He) is used as a carrier gas. As shown in FIG. 5, gaps between the gates 120 are completely filled without voids, and an interlayer dielectric film 130 composed of the first and second interlayer dielectric films 131 and 133 is completed.

Figure 6:
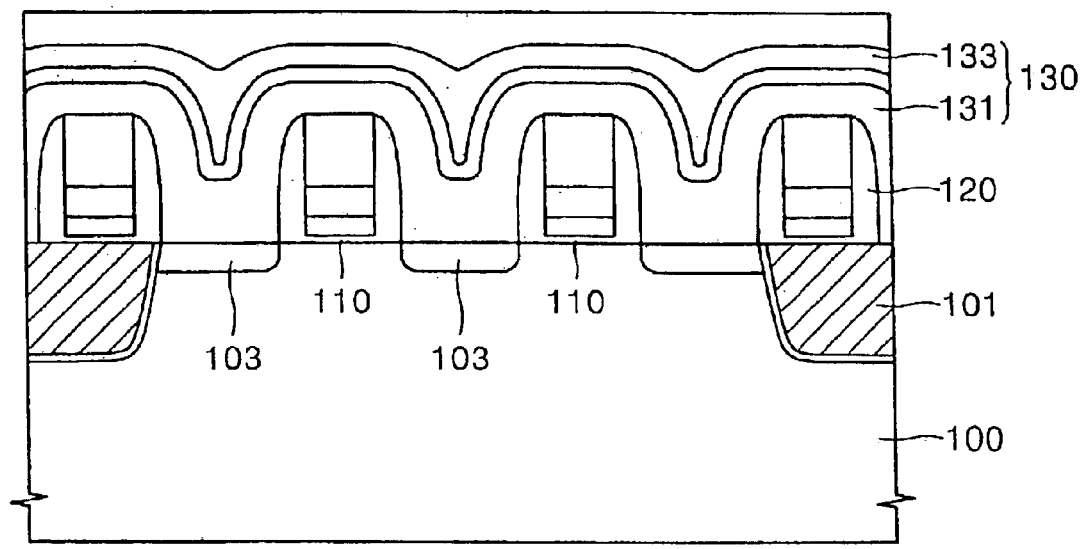

Referring to FIG. 6, the interlayer dielectric film 130 is planarized by chemical mechanical polishing (CMP) to remove a curvature and warpage formed on the second interlayer dielectric film 133 which are made during a general process of fabricating a semiconductor device. Next, in the case of fabricating the dynamic random access memory (DRAM) as in a preferred embodiment of the present invention, a bit line is formed by the subsequent processes used to form the bit line 150 shown in FIG. 1. Then, fabricating a semiconductor device is completed by performing subsequent processes depending on the characteristics of a product.

Figure 7A:
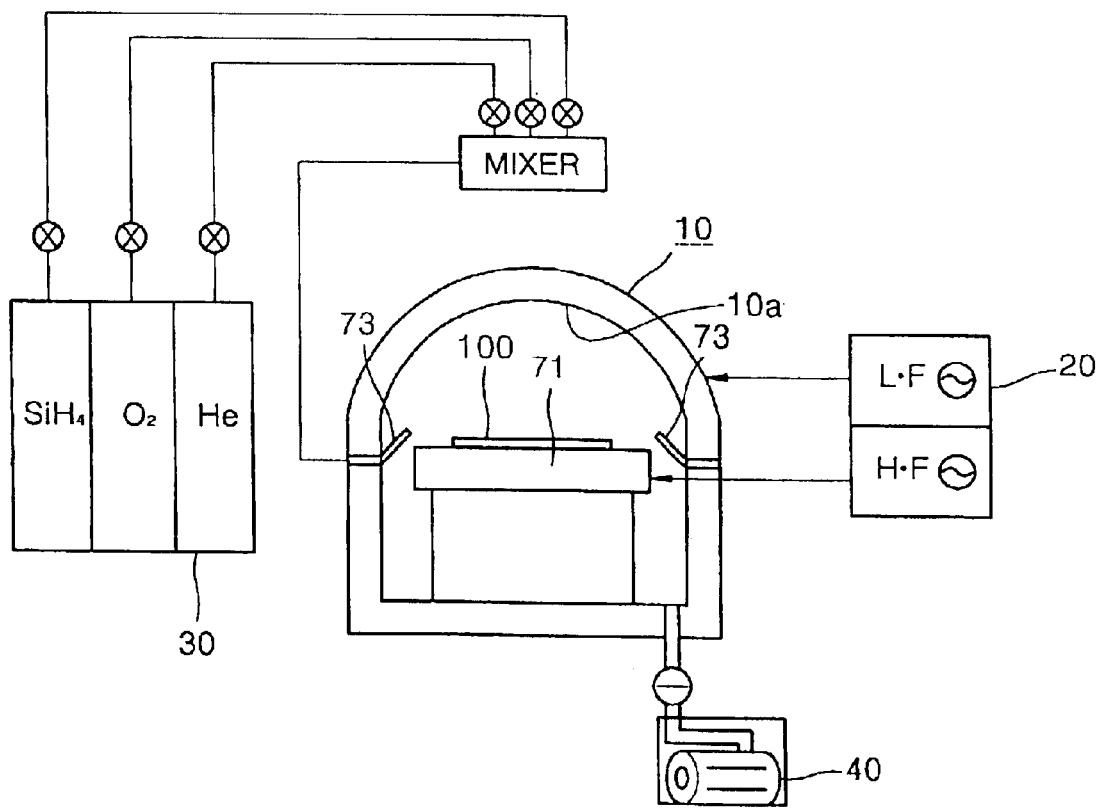
FIG. 7A shows an outline of an apparatus for manufacturing a semiconductor device according to an embodiment of the present invention, which is capable of forming an interlayer dielectric film using high-density plasma.
Figure 7B:
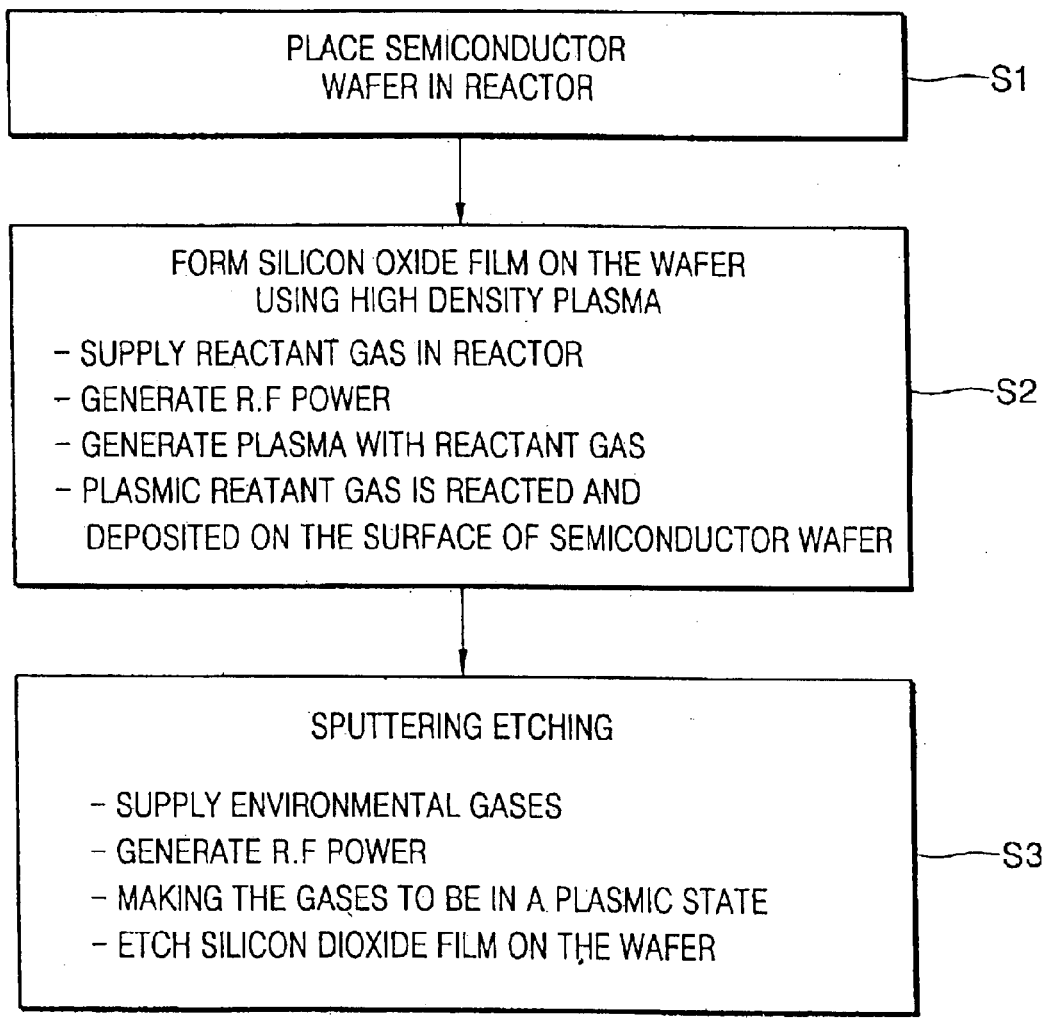
FIG. 7B is a flowchart for explaining a process for forming an interlayer dielectric film according to an embodiment of the present invention.
Figures 8, 9:
FIG. 8 is a table showing the conditions under which an oxide film is deposited and an interlayer dielectric film is sputtering-etched according to an embodiment of the present invention.
FIG. 9 shows a photograph of a cross-section of the semiconductor device shown in FIG. 3B taken by a scanning electron microscope (SEM)

FIG. 7A is a schematic diagram of an apparatus for manufacturing a semiconductor device according to an embodiment of the present invention in which an interlayer dielectric film is formed by CVD using high-density plasma. FIG. 7B is a flowchart for explaining a process of forming a first interlayer dielectric film according to an embodiment of the present with high-density plasma CVD. FIG. 8 is a table summarizing the process conditions under which the silicon oxide film ($1^{st}$ step) is formed and the sputtering etch ($2^{nd}$ step) is performed, which are proposed in the method of forming the first interlayer dielectric film with high-density CVD plasma shown in FIG. 7B. With reference to FIG. 8, a reactant gas, the flow rate of the reactant gas and high-frequency power applied to a reactor, e.g., radio frequency (RF) power, which are considered to be the most important in performing the above processes, are described.

Referring to FIG. 7A, an apparatus for fabricating a semiconductor device using high-density plasma includes a reactor 10 having a wafer supporter 71 on which the semiconductor wafer 100 is placed, gas suppliers 73, e.g., an injector or shower head, installed at the sides of the reactor 10 while facing the wafer supporter 71, and an AC frequency power generator 20 for applying AC frequency power to the reactor 10. Here, the AC frequency power generator 20 includes a plurality of frequency generators generating a plurality of frequencies. One is a high-frequency generator and the other is a low-frequency generator. The high-frequency generator is an RF (radio frequency) generator for generating a radio wave.

A gas supply unit 30 for supplying reactant gas and atmospheric gas is installed at the outside of the reactor 10, and a vacuum unit 40 having a vacuum pump, which is connected to one side of the reactor 10, keeps the pressure in the reactor 10 under 1 atm.

FIG. 7B is a flowchart explaining a method for forming an insulating film in the device for fabricating the semiconductor using high-density plasma as a preferred embodiment of the present invention. Referring to FIG. 7B, a method for forming an insulating film is divided into three main steps: (i) placing the semiconductor wafer 100 (refer to FIG. 7A) having a predetermined pattern in the reactor 10 (refer to FIG. 7A) (step 1); (ii) generating high-density plasma to form an insulating film on the semiconductor wafer 100 (step 2) and (iii) partially removing the insulating film through a sputtering etch (step 3).

In step 1 in which the semiconductor wafer 100 is prepared, the semiconductor wafer 100 having a predetermined pattern, e.g., a gate pattern, is placed in the reactor 10 of the apparatus for fabricating a semiconductor. Then, the environmental conditions in the reactor 10, e.g., pressure, temperature and reactant gas, are controlled to be suitable for the process required. That is, the reactor 10 (refer to FIG. 7A) is maintained to have low pressure and normal temperature (or high temperature if required), and an inert gas such as $N_2$ and Ar is used as atmospheric gas to regularly maintain the pressure and temperature in the reactor 10.

In step 2 in which an insulating film is formed using high-density plasma, a predetermined amount of reactant gases required during a deposition process are supplied to the reactor 10. Here, the reactant gases include silane gas ($SiH_4$) and oxygen gas ($O_2$) as source gases for a silicon oxide ($SiO_2$) film, and an inert gas such as helium gas (He) as an auxiliary gas that carries the silane gas ($SiH_4$) and oxygen gas ($O_2$) in the reactor 10 and reinforces the generation of plasma. With the supply of the reactant gases, a predetermined high frequency RF electric power is applied to the reactor 10. As a result, the reactant gases are changed into plasma containing electric charges through global discharge in the reactor 10, thus forming a plasma region over the semiconductor wafer 100. Then, the plasmic reactant gases are transferred to the semiconductor wafer 100 and then, a silicon oxide film ($SiO_2$) is deposited on the surface of the semiconductor wafer 100 with mutual chemical reaction (Si+O+O) between plasma. When an oxide film is formed by high-density plasma CVD deposited as described above, it is possible to achieve a high deposition rate and excellent step coverage. However, overhang may occur in a pattern having a predetermined phase difference, because an oxide film is deposited fast around the entrance of a gap of the pattern. Accordingly, the thickness of the deposited oxide film must be lower than half of the distance between gaps so that the gaps are not filled completely.

In step 3, after the insulating film is formed on the semiconductor wafer 100, the insulating film (silicon oxide film), which is easily formed on the entrance of a gap between patterns, is removed by a sputtering etch. The sputtering etch may be performed in another reactor or in situ, i.e., in reactor 10 in which only the supplied reactant gases and the process conditions are changed. Here, a reactant gas capable of generating plasma for sputtering, i.e. oxygen gas ($O_2$) and helium gas (He), are mixed and supplied to the reactor 10, or another reactor. While the gas for sputtering is supplied, low-frequency electric power is applied together with RF electric power to the reactor, thereby forming global discharge therein Then, oxygen gas ($O_2$) and helium gas (He) needed for sputtering are activated and converted into a plasma state containing an electric charge due to the global discharge, thus forming a plasma region on the top of the semiconductor wafer 100. The plasmic sputtering gas is accelerated toward the semiconductor wafer 100 to cause the ion bombardment, i.e., it collides against the silicon oxide film. Here, molecules of oxidized silicon ($SiO_2$) constituting the silicon oxide film are divided into atoms of silicon (Si) and oxygen (O), and separated from the semiconductor wafer 100 or ionized by accepting an electron, thereby performing a sputtering etch. During sputtering etch, an object is likely to be anisotropically etched and, therefore, a portion which is perpendicular to the ion direction can be etched quickly and, further, a silicon oxide film, which is deposited unstably at the corner of an inlet of a gap between patterns, is comparatively largely etched. Also, the silicon atoms separated due to ion bombardment may be recombined with the plasmic oxygen atoms and then deposited in gaps between gate patterns on the semiconductor wafer, which is called "redeposition."

After the sputtering etch, the interlayer dielectric film 131 is etched to be mountain-shaped around the gate pattern as shown in FIG. 3B and the photograph in FIG. 9. If a first interlayer insulating film is etched this way, overhang occurring when deposition is accelerated as silicon gas surges into an inlet of a gap, can be prevented when a second interlayer insulating film (generally, a silicon oxide film formed by high-density plasma CVD) is additionally deposited to form a gap between patterns. As a result, it is possible to prevent the void defect when a gap is filled with the second interlayer insulating film.

Referring to FIG. 8, silane gas ($SiH_4$), oxygen gas ($O_2$) and helium gas (He) are used as reactant gases during a process of forming a silicon oxide film, and oxygen gas ($O_2$) and helium gas (He) are also used during a sputtering etch. Here, although it is not directly needed in a deposition reaction or etching reaction, helium gas (He) functions as a carrier gas, i.e., it delivers other reactant gases such as silane gas ($SiH_4$) and/or oxygen gas ($O_2$) into a reactor, and, further, plays a decisive role as a mediator in forming high-density plasma. That is, when global discharge occurs, Helium (He) changes into plasma and moves in a reactor while exchanging electrons with neighboring reactant gases, thereby increasing the amount of the ion bombardment. Therefore, when a silicon oxide film is formed, high-density plasma is obtained by changing silane gas ($SiH_4$) and oxygen gas ($O_2$) into a plasma state, so that high-speed deposition is realized. For this reason, it is very important to control the amount of reactant gas carefully, because the deposition speed is sensitive to the amount of the reactant gas supplied.

According to an embodiment of the present invention, the flow rate of silane gas ($SiH_4$) is within the range of 30~2000 sccm and the flow rate of oxygen gas ($O_2$) is within the range of 50~500 sccm. The amount of oxygen gas ($O_2$) must be larger than that of silane gas ($SiH_4$). Further, 50~1000 sccm of helium gas (He), which functions as the carrier gas, must be supplied sufficient quantity to carry the reaction gases, i.e., silane gas ($SiH_4$) and oxygen gas ($O_2$), into a reactor.

Power having a predetermined frequency, e.g., RF power, must be applied to the reactor 10 (shown in FIG. 7A), so that the above reaction gases can be changed into plasma. Specifically, high-frequency (HF) power is applied to the wafer supporter 71 (shown in FIG. 7A) for supporting the semiconductor wafer 100 and low-frequency (LF) power is applied to an upper wall 10a (shown in FIG. 7A) of the reactor 10 (shown in FIG. 7A) facing the semiconductor wafer 100. Specifically, RF power is 13.56 9+MHz applied to the wafer supporter 71, and low frequency power from 100 KHz to 1000 KHz is applied to the upper wall 10a of the reactor 10 facing the wafer supporter 71. However, regarding the intensity of electric power, the LF power applied to the upper wall of the reactor 10 is 2500~3500 W, and the HF power applied to the wafer supporter 71 is 500~1500 W. That is, the LF power level is greater than the HF power level.

In the sputtering etch in an embodiment of the present invention, helium gas (He) changes into plasma while carrying a small amount of oxygen gas ($O_2$) into the reactor 10 so that the oxygen gas ($O_2$) is changed into plasma, thereby producing high-density ionized particles. The produced high-density ionized particles are accelerated by a DC drop of the semiconductor wafer 100 generated on a plasma region, and collide against a silicon oxide film formed on the semiconductor wafer 100, thereby realizing a remarkably fast sputtering etch. 0~500 sccm of oxygen gas ($O_2$) and 0~1000 sccm of helium gas (He) are supplied as sputtering gas. The amount of the supplied helium gas (He) is changed dependently with that of the supplied oxygen gas ($O_2$). Here, during the sputtering etch, oxygen gas ($O_2$) and helium gas (He) may be used separately, or be mixed together and used as a sputtering gas. However, it is preferable that oxygen gas ($O_2$) and helium gas (He) are mixed at a proper rate and used, because bubbles and particles generated when a silicon oxide film is formed can be suppressed with the use of oxygen gas (O$_2$) and the use of helium gas (He), respectively. In the event that the sputtering etch is performed only with helium gas (He), redeposition of a silicon oxide film due to recombination of oxygen (O) atoms and silicon (Si) atoms does not happen during the sputtering etch, i.e. only the sputtering etch is performed. Because the etching speed depends on the frequency of collision of ion particles during the sputtering etch, more HF power and LF power must be applied than when a silicon oxide film is formed For instance, the LF power is 3500~5000 W and the HF power is 2000~3000 W.

As described above, in the method for fabricating a semiconductor device according to an embodiment of the present invention, an insulating film is formed using high-density plasma CVD and sputtering etch is then performed thereon in situ when a gap between gate patterns on the semiconductor wafer 100 is filled with an interlayer insulating film. Therefore, the gaps between gate patterns can be filled without voids, thereby securing process stability.

Further, the physical and electrical reliability of a semiconductor device can be highly enhanced because no void defects are formed therein, especially, between gate patterns which are important constituents of a MOS transistor.

Although in the embodiment of the present invention a silicon oxide film is used as an insulating film for filling gaps between gate patterns, other films such as a silicon nitride film or silicon oxynitride film can be used. In this case, a chemical etchant such as phosphoric acid (H$_3$PO$_4$) must be used to etch the silicon nitride film.

Also, the insulating film obtained through the method for forming an insulating film by high-density plasma CVD according to an embodiment of the present invention is available as an insulating film for filling the gap in other pattern such as a gate pattern in which gaps are formed at a predetermined interval, e.g., a bit line pattern or a metal interconnection pattern.

Also, in the method for generating high-density plasma according to an embodiment of the present invention, helicon source or electron cyclotron resonance, as well as radio frequency waves, can be used.

In the method for fabricating a semiconductor device according to an embodiment of the present invention, after the completion of a gate pattern, a predetermined thickness of the interlayer dielectric film is etched by a sputter etch, which is a type of dry etching method, and gaps between patterns are filled with the interlayer dielectric film using high density plasma CVD, thereby easily filling the gaps between patterns without void defects.

In the method for forming an insulating film using high density plasma CVD according to the present invention, no voids are formed in an interlayer dielectric film formed between gates of a semiconductor device and therefore, fatal defects such cracks hardly occur, thus producing a semiconductor device having physical and electric reliability.

What is claimed is:

1. A method for forming an interlayer dielectric film by high-density plasma, using an apparatus for fabricating a semiconductor device which includes a reactor having a wafer supporter on which a semiconductor wafer is placed and a gas supplier for supplying reactant gas to the semiconductor wafer, and is used for generating high-density plasma for chemical vapor deposition, the method comprising the steps of:

(a) placing the semiconductor wafer having a predetermined pattern in the reactor;

(b) supplying reactant gas to the semiconductor wafer in the reactor while the reactor is maintained to have low pressure;

(c) changing the reactant gas into a plasma state and bringing the plasmic reactant gas into contact with a surface of the semiconductor wafer, so that a first interlayer dielectric film is formed;

(d) providing an atmospheric gas into the reactor;

(e) performing a sputtering etch on the first interlayer dielectric film by changing the atmospheric gas into plasma and colliding the plasma against the wafer surface;

(f) performing a wet etch on the first interlayer dielectric film after the sputtering etch; and (g) forming a second interlayer dielectric film on the first interlayer dielectric film.

2. The method of claim 1, wherein the reaction gas comprises silane gas (SiH$_4$) and oxygen gas (O$_2$).

3. The method of claim 2, wherein more oxygen gas (O$_2$) is supplied than silane gas (SiH$_4$).

4. The method of claim 2, wherein the silane gas (SiH$_4$) is supplied at a flow rate of 30~300 sccm.

5. The method of claim 2, wherein the reactant gas further comprises oxygen gas (O$_2$) and helium gas (He) as reactant auxiliary gas.

6. The method of claim 2, wherein the oxygen gas (O$_2$) is supplied at a flow rate of 50~500 sccm.

7. The method of claim 5, wherein the helium gas (He) is supplied at a flow rate of 50~1000 sccm.

8. The method of claim 1, wherein the step (c) further comprises applying high-frequency power to the reactor.

9. The method of claim 8, wherein low-frequency power is further applied to the reactor.

10. The method of claim 9, wherein the high-frequency power is less than the low-frequency power.

11. The method of claim 8, wherein the high-frequency power is radio frequency power.

12. The method of claim 10, wherein the high-frequency power is applied to the wafer supporter and the low frequency power is applied to an upper wall of the reactor.

13. The method of claim 12, wherein the low-frequency power is in a range of 2500~3500 W.

14. The method of claim 12, wherein the high-frequency power is in the range of 500~1500 W.

15. The method of claim 1, wherein the interlayer dielectric film comprises a silicon oxide (SiO$_2$) film.

16. The method of claim 1, wherein the atmospheric gas for the sputtering etch in the step (e) comprises at least one of oxygen gas (O$_2$) and helium gas (He).

17. The method of claim 16, wherein the oxygen gas (O$_2$) is supplied at a flow rate of 0~500 sccm.

18. The method of claim 16, wherein the helium gas (He) is supplied at a flow rate of 0~1000 sccm.

19. The method of claim 1, wherein the step (e) further comprises a step of applying high-frequency power and low-frequency power to the reactor at a same time.

20. The method of claim 19, wherein the high-frequency power comprises radio frequency power.

21. The method of claim 19, wherein the low-frequency power is in a range of 100~1000 kHz.

22. The method of claim 19, wherein the high-frequency power is applied to the wafer supporter and the low-frequency power is applied to the upper wall of the reactor.

23. The method of claim 22, wherein the low-frequency power is greater than the high-frequency power.

24. The method of claim 22, wherein the low-frequency power applied is in a range of 3500~5000 W.

25. The method of claim 22, wherein the high-frequency power applied is in a range of 500~3000 W.

* * * * *